United States Patent
Seo et al.

(10) Patent No.: US 9,318,181 B2
(45) Date of Patent: Apr. 19, 2016

(54) MAGNETIC MEMORY DEVICES INCLUDING SHARED LINES

(71) Applicants: Bo-Young Seo, Suwon-si (KR);
Yong-Kyu Lee, Gwacheon-si (KR);
Choong-Jae Lee, Hwasung-si (KR);
Kee-Moon Chun, Seongnam-si (KR);
Hee-Seog Jeon, Suwon-si (KR)

(72) Inventors: Bo-Young Seo, Suwon-si (KR);
Yong-Kyu Lee, Gwacheon-si (KR);
Choong-Jae Lee, Hwasung-si (KR);
Kee-Moon Chun, Seongnam-si (KR);
Hee-Seog Jeon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/448,717

(22) Filed: Jul. 31, 2014

(65) Prior Publication Data

US 2015/0155024 A1  Jun. 4, 2015

(30) Foreign Application Priority Data

Dec. 4, 2013 (KR) .................. 10-2013-0150004

(51) Int. Cl.
*G11C 11/00* (2006.01)
*G11C 11/16* (2006.01)

(52) U.S. Cl.
CPC ........ *G11C 11/1675* (2013.01); *G11C 11/1659* (2013.01); *G11C 11/16* (2013.01)

(58) Field of Classification Search
CPC ......... G11C 11/16; G11C 11/15; H01L 43/08
USPC ................. 365/158, 148, 171, 209
IPC ....... G11C 11/16, 11/15; H01L 43/08
See application file for complete search history.

(56) References Cited

U.S. PATENT DOCUMENTS

| | | | |
|---|---|---|---|
| 6,331,943 B1 | 12/2001 | Naji et al. | |
| 6,421,271 B1 | 7/2002 | Gogl et al. | |
| 6,924,520 B2 | 8/2005 | Park et al. | |
| 6,937,505 B2 * | 8/2005 | Morikawa ............. | G11C 11/15 257/E27.004 |
| 7,170,777 B2 | 1/2007 | Choi et al. | |
| 7,436,699 B2 | 10/2008 | Tanizaki et al. | |
| 8,295,082 B2 | 10/2012 | Chua-Eoan et al. | |
| 8,395,924 B2 * | 3/2013 | Lee .......................... | G11C 8/14 365/148 |
| 2002/0018360 A1 | 2/2002 | Hartmann | |
| 2009/0103354 A1 | 4/2009 | Yoon et al. | |
| 2009/0237988 A1 * | 9/2009 | Kurose .................. | G11C 11/16 365/171 |
| 2010/0208515 A1 * | 8/2010 | Aoki ...................... | B82Y 25/00 365/171 |
| 2012/0257444 A1 * | 10/2012 | Oh ..................... | G11C 11/1675 365/158 |
| 2013/0301335 A1 * | 11/2013 | Ong ....................... | G11C 29/12 365/148 |
| 2015/0221699 A1 * | 8/2015 | Lee ...................... | H01L 27/228 257/252 |

FOREIGN PATENT DOCUMENTS

| | | |
|---|---|---|
| JP | 2006-186109 A | 7/2006 |
| KR | 10-0681812 B1 | 2/2007 |
| KR | 10-1048353 B1 | 7/2011 |

* cited by examiner

*Primary Examiner* — Connie Yoha
(74) *Attorney, Agent, or Firm* — Myers Bigel & Sibley, P.A.

(57) ABSTRACT

A magnetic memory device includes word lines, bit lines intersecting the word lines, magnetic memory elements disposed at intersections between the word lines and the bit lines, and selection transistors connected to the word lines. The magnetic memory elements share a word line among the plurality of word lines and also share a selection transistor connected to the word line that is shared among the selection transistors. Related systems and operating methods are also described.

10 Claims, 12 Drawing Sheets

| | SL | | WL | | BL | |
|---|---|---|---|---|---|---|
| | Select | Unselect | Select | Unselect | Select | Unselect |
| READ | 0 | 0 | VDD | 0 | VREAD | VFLOAT |
| WRITE"0" | 0 | 0 | VDD | 0 | VWRITE | VFLOAT |
| WRITE"1" | VWRITE | 0 | VDD | 0 | 0 | VFLOAT |

1200

US 9,318,181 B2

MAGNETIC MEMORY DEVICES INCLUDING SHARED LINES

CROSS-REFERENCE TO RELATED APPLICATION

This application claims priority from Korean Patent Application No. 10-2013-0150004 filed on Dec. 4, 2013 in the Korean Intellectual Property Office, the disclosure of which is incorporated herein by reference in its entirety.

BACKGROUND

1. Field

The present inventive concepts relate to a magnetic memory device, an operating method of the magnetic memory device and a semiconductor system including the magnetic memory device.

2. Description of the Related Art

Dynamic Random Access Memories (DRAMs) have high operating speed and low power consumption. However, DRAMs are volatile and thus lose data when the power is turned off. On the other hand, flash memory devices are nonvolatile and can thus retain data even when the power is cut off. Flash memory devices can be miniaturized and can provide high access speed. However, flash memory devices may have low operating speed and may require a high operating voltage.

Various memory devices such as magnetic memory devices or magnetic random access memories that can integrate the advantages of DRAMs and flash memory devices have been developed. Magnetic memory devices use variations in the resistive state of a magnetic material that result from variations in the magnetization direction of the magnetic material, and are renowned for their excellent stability.

SUMMARY

Aspects of the present inventive concepts provide a magnetic memory device which can be reduced in size to be embeddable, an operating method of the magnetic memory device and a semiconductor system including the magnetic memory device.

Aspects of the present inventive concepts also can provide a magnetic memory device which can improve the current driving performance of selection transistors, an operating method of the magnetic memory device and a semiconductor system including the magnetic memory device.

However, aspects of the present invention concepts are not restricted to the ones set forth herein. The above and other aspects of the present inventive concepts will become more apparent to one of ordinary skill in the art to which the present inventive concepts pertain by referencing the detailed description of the present inventive concepts given below.

According to an aspect of the present inventive concepts, there is provided a magnetic memory device comprising a plurality of word lines, a plurality of bit lines intersecting the word lines and a plurality of magnetic memory elements, a respective one of which is disposed at a respective intersection between the plurality word lines and the plurality of bit lines. A respective one of the plurality of selection transistors is connected to a respective one of the plurality of word lines. The plurality of magnetic memory elements sharing a word line among the plurality of word lines also share a selection transistor connected to the word line that is shared among the plurality of selection transistors.

According to other aspects of the present inventive concepts, there is provided an operating method of a magnetic memory device, comprising a plurality of word lines, a plurality of bit lines intersecting the word lines, a plurality of magnetic memory elements, a respective one of which is disposed at an intersection between the plurality of word lines and the plurality of bit lines, and a plurality of selection transistors connected to the plurality word lines, wherein the plurality of magnetic memory elements sharing a word line among the plurality of word lines also share a selection transistor connected to the word line that is shared among the plurality of selection transistors. During a read operation or a program operation, the operating method comprises providing a supply voltage to a selected word line among the plurality of word lines, providing a read voltage or a program voltage to a selected bit line among the plurality of bit lines and providing a floating voltage to the non-selected bit lines among the plurality of bit lines.

According to yet other aspects of the present inventive concepts, there is provided a magnetic memory device, comprising a plurality of word line patterns extending in a first direction, a plurality of bit line patterns extending in a second direction which intersects the first direction, a plurality of source line patterns extending in the first direction, a respective one of which is disposed between a respective pair of adjacent word line patterns among the plurality of word line patterns, and a plurality of magnetic memory elements disposed below the plurality of bit line patterns.

According to other aspects of the present inventive concepts, there is provided a magnetic memory device comprising first and second metal wiring patterns extending in a first direction, a plurality of bit lines extending in a second direction and intersecting the first and second metal wiring patterns, a plurality of magnetic memory elements, a respective one of which is disposed between a respective intersection of the first and second metal wiring patterns and the plurality of bit lines, first and second word lines extending in the first direction and a source line extending in the first direction between the first and second metal wiring patterns. A first selection field effect transistor (FET) is provided, a drain of which is connected to the first metal wiring pattern, a source of which is connected to the source line and a gate of which is connected to the first word line. Moreover, a second selection FET is also provided, a drain of which is connected to the second metal wiring pattern, a source of which is connected to the source line and a gate of which is connected to the second word line. In some embodiments, the first word line is between the first metal wiring pattern and the source line, and the second word line is between the second metal wiring pattern and the source line. In other embodiments, the first and second selection FETs are offset from the plurality of magnetic memory elements in the first direction. In yet other embodiments, the first and second word lines intersect the plurality of bit lines. Finally, the source line may intersect the plurality of bit lines.

According to still other aspects of the present inventive concepts, there is provided a semiconductor system comprising a processor configured to process data, and a memory device configured to store the data, wherein the processor and/or the memory device includes at least one magnetic memory device according to any of the embodiments described herein. For example, the magnetic memory device comprises a plurality of word lines, a plurality of bit lines intersecting the word lines, a plurality of magnetic memory elements, a respective one of which is disposed at an intersection between the plurality of word lines and the plurality of bit lines, and a plurality of selection transistors that are connected to the plurality word lines, wherein the plurality of magnetic memory elements sharing a word line among the plurality of word lines also share a selection transistor connected to the word line that is shared among the plurality of selection transistors.

Other features and aspects may be apparent from the following detailed description, the drawings, and the claims.

BRIEF DESCRIPTION OF THE DRAWINGS

The above and other aspects and features of the present inventive concepts will become more apparent by describing in detail various embodiments thereof with reference to the attached drawings, in which.

DETAILED DESCRIPTION OF THE EMBODIMENTS

Figure 1:
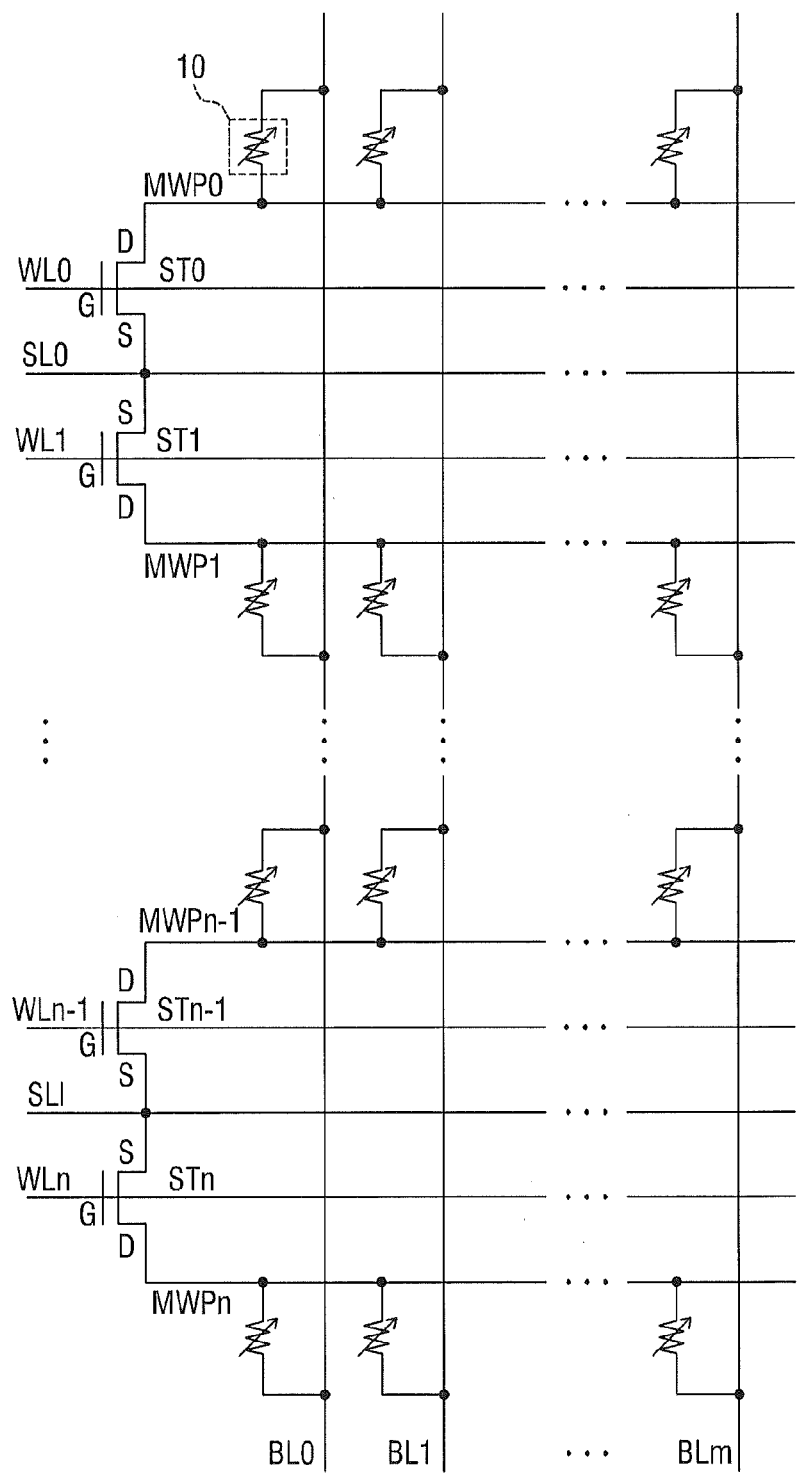
FIG. 1 is a diagram illustrating a magnetic memory device according to various embodiments of the inventive concepts.

The present inventive concepts will now be described more fully hereinafter with reference to the accompanying drawings, in which various embodiments of the inventive concepts are shown. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions may be exaggerated for clarity.

It will also be understood that when a layer is referred to as being "on" or "connected to" another layer or substrate, it can be directly on or connected to the other layer or substrate, or intervening layers may also be present. In contrast, when an element is referred to as being "directly on" or "directly connected to" another element, there are no intervening elements present. As used herein, the term "and/or" includes any and all combinations of one or more of the associated listed items and may be abbreviated as "/".

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or example terms provided herein are intended merely to better illuminate the inventive concepts and are not a limitation on the scope of the inventive concepts unless otherwise specified. Further, unless defined otherwise, all terms defined in generally used dictionaries may not be overly interpreted.

The present inventive concepts will be described with reference to perspective views, cross-sectional views, and/or plan views, in which various embodiments of the inventive concepts are shown. Thus, the profile of a view may be modified according to manufacturing techniques and/or allowances. That is, the embodiments of the inventive concepts are not intended to limit the scope of the present inventive concepts but cover all changes and modifications that can be caused due to a change in manufacturing process. Thus, regions shown in the drawings are illustrated in schematic form and the shapes of the regions are presented simply by way of illustration and not as a limitation.

FIG. 1 is a diagram illustrating a memory system including a magnetic memory device, according to various embodiments of the inventive concepts.

Referring to FIG. 1, a magnetic memory device 1 has a cell array structure including a plurality of word lines WL0 through WLn, a plurality of bit lines BL0 through BLm, a plurality of metal wiring patterns MWP0 through MWPn, a plurality of source lines SL0 through SU, a plurality of selection transistors ST0 through STn, and a plurality of magnetic memory elements 10.

The word lines WL0 through WLn may intersect the bit lines BL0 through BLm.

The source lines SL0 through SL1 may be arranged in parallel with the word lines WL0 through WLn, and may thus intersect the bit lines BL0 through BLm. The source lines SL0 through SD may be disposed between the word lines WL0 through WLn.

The selection transistors ST0 through STn may be connected to the word lines WL0 through WLn, respectively. The selection transistors ST0 through STn may comprise Field Effect Transistors (FETs). More specifically, the gates G of the selection transistors ST0 through STn may be connected to the word lines WL0 through WLn. A pair of adjacent selection transistors, among the selection transistors ST0 through STn, shares a single source line together, wherein the sources S of the pair of adjacent selection transistors are connected to each other and to the single source line.

The magnetic memory elements 10 may be respectively disposed at the intersections between the metal wiring patterns MWP0 through MWPn and the bit lines BL0 through BLm. In a typical magnetic memory device, a single memory cell includes a single selection transistor and a single magnetic memory. On the other hand, in other embodiments, more than one magnetic memory 10 may share a single selection transistor.

More specifically, magnetic memory elements 10 that share one of the word lines WL0 through WLn may also share one of the selection transistors ST0 through STn connected to the word line shared therebetween. First terminals of the magnetic memory elements 10 may be connected to the drain D of the selection transistor shared between the magnetic memory elements 10 via the metal wiring patterns MWP0 through MWPn, and second terminals of the magnetic memory elements 10 may be respectively connected to the bit lines BL0 through BLm. The selection transistors ST0 through STn may control the supply of a write current to the magnetic memory elements 10.

The magnetic memory elements 10 may store data by using their resistive state that that varies according to a magnetization direction. In an example, each of the magnetic memory elements 10 may include a magnetic tunnel junction (MTJ). The magnetic memory elements 10 may store data by using a spin transfer torque (STT) phenomenon, i.e., the variation of the magnetization direction of a magnetic layer according to a write current, and this will hereinafter be described in detail with reference to FIG. 2.

Figure 2:
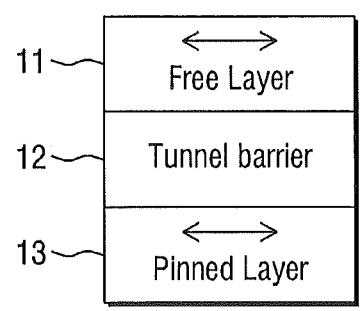
FIG. 2 is a diagram illustrating a magnetic memory illustrated in FIG. 1.

FIG. 2 is a diagram illustrating an embodiment of a magnetic memory 10 illustrated in FIG. 1.

Referring to FIG. 2, a magnetic memory 10 may include a first magnetic layer 11, a second magnetic layer 13, and a dielectric layer 12 disposed between the first magnetic layer 11 and the second magnetic layer 13.

The first magnetic layer 11 may be a free layer having a magnetization direction that may vary according to a write current. In an example, the first magnetic layer 11 may be formed of a strong magnetic material. The first magnetic layer 11 may be connected to one of the bit lines BL0 through BLm illustrated in FIG. 1.

The second magnetic layer 13 may be a pinned layer having a fixed magnetization direction regardless of a write current. In an example, the second magnetic layer 13 may be formed of a strong magnetic material. The second magnetic layer 13 may be connected to one of the drains of the selection transistors ST0 through STn illustrated in FIG. 1.

The dielectric layer 12 may be a tunnel barrier layer. The dielectric layer 12 may vary the magnetization direction of the first magnetic layer 11. In an example, the dielectric layer 12 may include an oxide, a nitride and/or an oxynitride. In another example, the dielectric layer 12 may include magnesium oxide, magnesium nitride, magnesium oxynitride, silicon oxide, silicon nitride, silicon oxynitride, silicon carbide, aluminum oxide, aluminum nitride, aluminum oxynitride, calcium oxide, nickel oxide, hafnium oxide, tantalum oxide, zirconium oxide, and/or manganese oxide.

The first magnetic layer 11, the second magnetic layer, and the dielectric layer 12 may form an MTJ. The magnetic memory 10 may store data depending on whether or not the magnetization direction of the first magnetic layer 11 is identical to the magnetization direction of the second magnetic layer 13.

In response to a write current flowing in a direction from the first magnetic layer 11 to the second magnetic layer 13, the first magnetic layer 11 and the second magnetic layer 13 may have different magnetization directions, and the magnetic memory 10 may have a high resistive state and store a first data value of, for example, "0". In response to the write current flowing in a direction from the second magnetic layer 13 to the first magnetic layer 11, the first magnetic layer 11 and the second magnetic layer 13 may have the same magnetization direction, and the magnetic memory 10 may have a low resistive state and store a second data value of, for example, "1".

The magnetic memory 10 may also include an upper metal electrode (not illustrated) disposed on the first magnetic layer 11 and a lower metal electrode (not illustrated) disposed below the second magnetic layer 13. As an alternative to the above description of the first magnetic layer 11 and the second magnetic layer 13, the first magnetic layer 11 may be formed as a pinned layer, and the second magnetic layer 13 may be formed as a free layer.

FIG. 1 also illustrates a magnetic memory device 1 according to various other embodiments of the inventive concepts, wherein the magnetic device comprises first and second metal wiring patterns MWP0 and MWP1, extending in a first direction, for example the horizontal direction. A plurality of bit lines BL0 through BLm extend in a second direction, for example in the vertical direction, and intersect the first and second metal wiring patterns MWP0 and MWP1. A plurality of magnetic memory elements 10 are also provided, a respective one of which is disposed between a respective intersection of the first and second metal wiring patterns MWP0 and MWP1, respectively, and the plurality of bit lines BL0 through BLm. First and second word lines WL0 and WL1, respectively, are provided, extending in the first direction. A source line SL0 is also provided extending in the first direction, between the first and second metal wiring patterns MWP0 and MWP1, respectively. A first selection FET ST0 is also provided, a drain D of which is connected to the first metal wiring pattern MWP0, a source S of which is connected to the source line SL0, and a gate G of which is connected to the word line WL0. A second selection FET ST1 is also provided, a drain D of which is connected to the second metal wiring pattern MWP1, a source S of which is connected to the source line SL0, and a gate G of which is connected to the second word line WL1.

As also illustrated in FIG. 1, the first word line WL0 is between the first metal wiring pattern MWP0 and the source line SL0, and the second word line WL1 is between the second metal wiring pattern MWP1 and the source line SL0. As also illustrated in FIG. 1, the first and second selection FETs ST0 and ST1, respectively, are offset from the plurality of magnetic memory elements 10 in the first direction, for example the horizontal direction. As also illustrated in FIG. 1, the first and second word lines WL0 and WL1, respectively, also intersect the plurality of bit lines BL0 through BLm.

Finally, as also illustrated in FIG. 1, the source line SL0 also intersects the plurality of bit lines BL0 through BLm.

Figure 3:
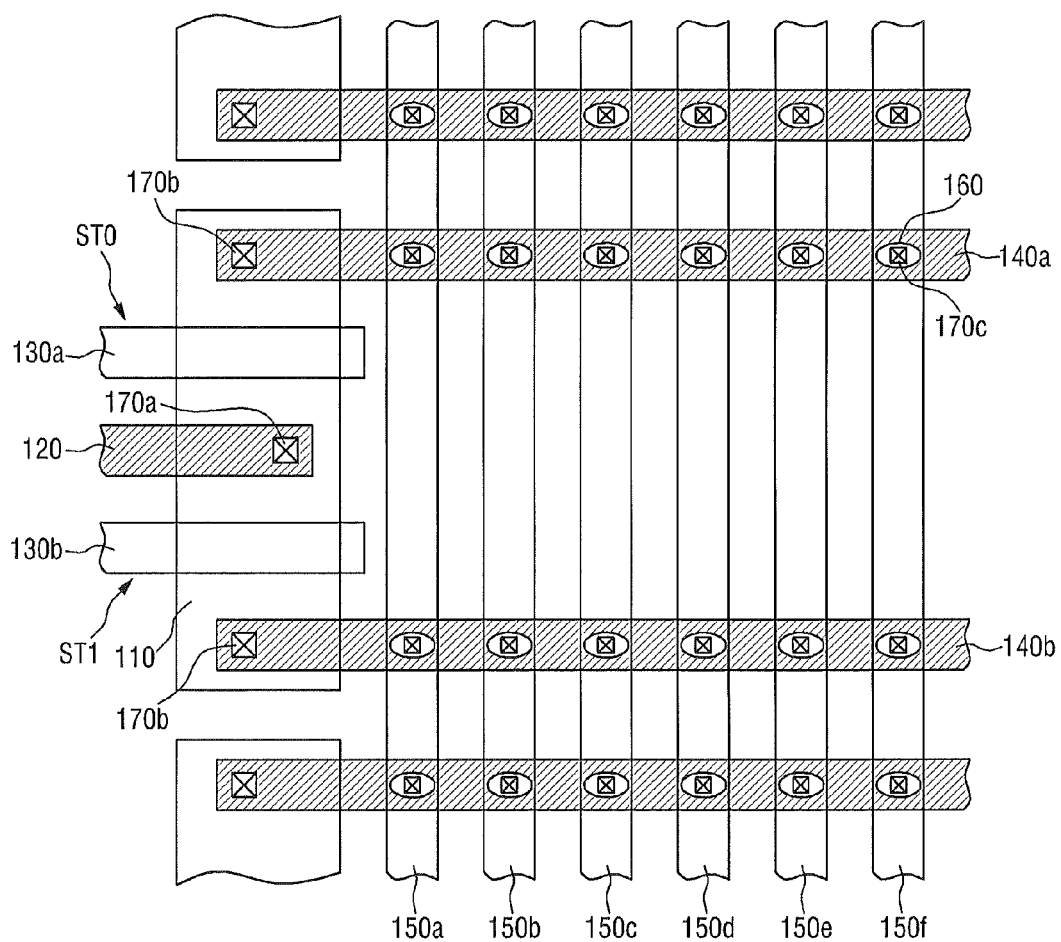
FIG. 3 is a diagram illustrating an example of the layout of the magnetic memory device of FIG. 1.

FIG. 3 is a diagram illustrating an example of a layout of the magnetic memory device 1.

Referring to FIG. 3, a layout 1a of the magnetic memory device 1 may have a plurality of active regions 110, a plurality of word line patterns (including a pair of word line patterns 130a and 130b), a plurality of bit line patterns 150a through 150f, a plurality of source line patterns (including a source line pattern 120), a plurality of metal wiring patterns (including a pair of metal wiring patterns 140a and 140b), a plurality of selection transistors (including selection transistors ST0 and ST1), and a plurality of MTJ devices 160.

The active regions 110 may extend in a first direction, for example, a vertical direction. The active regions 110 may be formed to be isolated from one another.

The word line patterns 130a and 130b may extend in a second direction, for example, a horizontal direction. The first direction and the second direction may intersect each other. The word line patterns 130a and 130b may intersect an active region 110.

The bit line patterns 150a through 150f may extend in the first direction. The bit line patterns 150a through 150f may be isolated from the active regions 110. The bit line patterns 150a through 150f may be arranged not to intersect the word line patterns 130a and 130b.

The source line pattern 120 may extend in the second direction. That is, the source line pattern 120 may be aligned in parallel with the word line patterns 130a and 130b. In an example, the source line pattern 120 may be disposed between the word line patterns 130a and 130b, and the end of the source line pattern 120 may overlap part of an active region 110 between the word line patterns 130a and 130b.

The metal wiring patterns 140a and 140b may extend in the second direction. The metal wiring patterns 140a and 140b may intersect the bit line patterns 150a through 150f. In an example, the ends of the metal wiring patterns 140a and 140b may overlap an active region 110. The word line patterns 130a and 130b may be disposed between, and isolated from, the source line pattern 120 and the metal wiring patterns 140a and 140b, and the ends of the metal wiring patterns 140a and 140b may overlap either end of an active region 110. In an embodiment, the ends of the metal wiring patterns 140a and 140b may partially overlap an active region 110.

The selection transistors ST0 and ST1 may be defined on either side of the source line pattern 120 and may be respectively disposed near the intersections between the word line patterns 130a and 130b and an active region 110. The word line patterns 130a and 130b may serve as gate electrodes for the selection transistors ST0 and ST1, respectively. The drains of the selection transistors ST0 and ST1 may be defined on first sides of the word line patterns 130a and 130b (for example, on the sides of the word line patterns 130a and 130b facing the metal wiring patterns 140a and 140b), respectively, and the sources of the selection transistors ST0 and ST1 may be defined on second sides of the word line patterns 130a and 130b (for example, on the sides of the word line patterns 130a and 130b facing the source line pattern 120), respectively. The source line patterns and the active regions 110 may be electrically connected by a plurality of first contact plugs 170a, and the metal wiring patterns 140a and 140b and the active regions 110 may be electrically connected by a plurality of second contact plugs 170b.

The MTJ devices 160 may be disposed below the bit line patterns 150a through 150f. The MTJ devices 160 may be respectively disposed near the intersections between the bit line patterns 150a through 150f and the metal wiring patterns.

One of the metal wiring patterns 140a and 140b may be overlapped with a group of MTJ devices 160. The bit line patterns 150a through 150f, the metal wiring patterns 140a and 140b and the MTJ device 160 may be electrically connected by a plurality of third contact plugs 170c. In an example, the MTJ devices 160 may be configured to have substantially the same structure as the magnetic memory 10 illustrated in FIG. 2. In this example, the free layers of the MTJ devices 160 may be connected to the bit line patterns 150a through 150f, and the pinned layers of the MTJ devices 160 may be connected to the metal wiring patterns 140a and 140b. However, the opposite connections may also be provided in other embodiments.

In the layout 1a, the source line pattern 120 is disposed between the word line patterns 130a and 130b that are adjacent to each other, and extends in the second direction, and the MTJ devices 160 are disposed below the bit line patterns 150a through 150f. Accordingly, the size of the magnetic memory device 1 in a direction (for example, the horizontal direction) in which the magnetic memory device 1 is to be embedded can be reduced. In addition, in the layout 1a, the selection transistor ST0 controls the MTJ devices 160 that are connected to the metal wiring pattern 140a, and the selection transistor ST1 controls the MTJ devices 160 that are connected to the metal wiring pattern 140b. Accordingly, the effective width of the active regions 110 for the selection transistors ST0 and ST1 can be increased, and the current driving performance of the selection transistors ST0 and ST1 can be improved.

Figure 4:
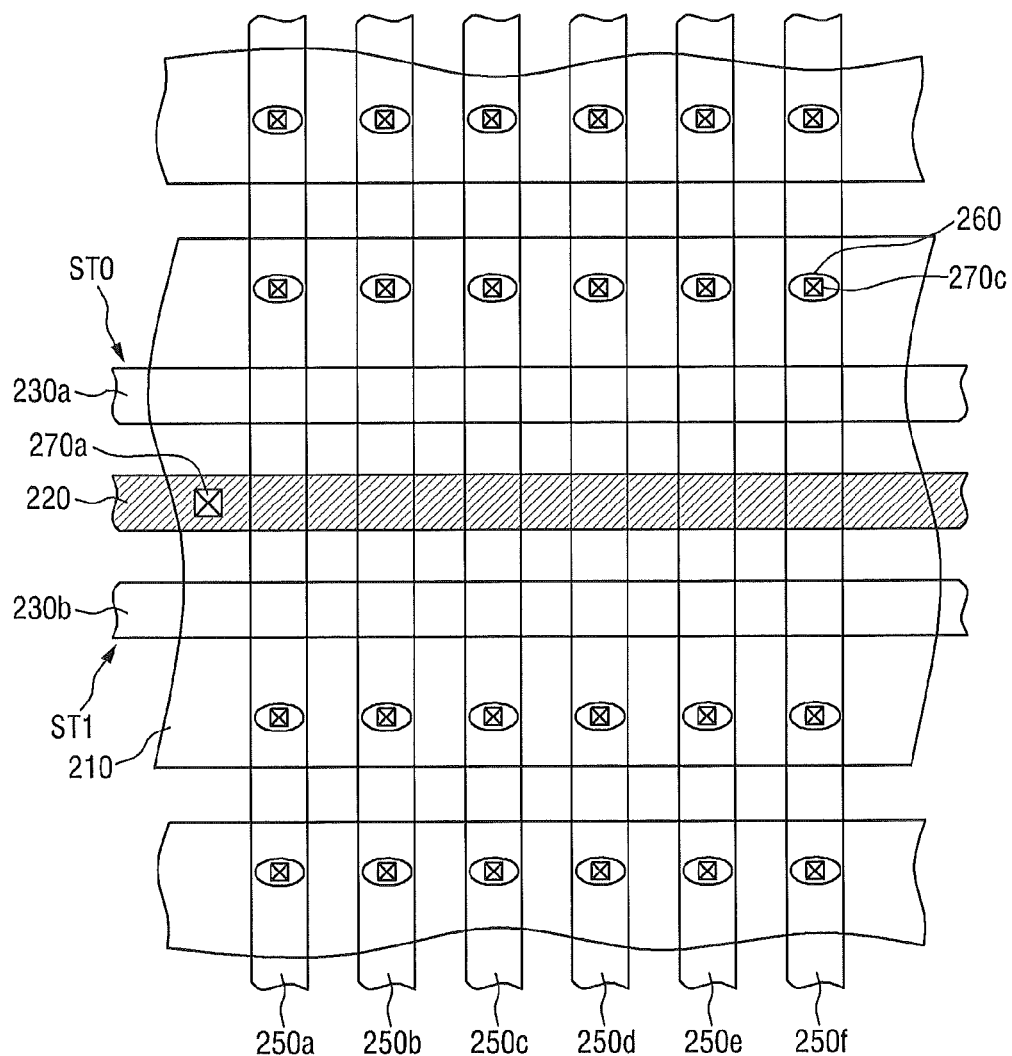
FIG. 4 is a diagram illustrating another example of the layout of the magnetic memory device of FIG. 1.

FIG. 4 is a diagram illustrating another example of another layout of the magnetic memory device 1.

Referring to FIG. 4, the layout 1b of the magnetic memory device 1 may include a plurality of active regions 210, a plurality of word line patterns (including word line patterns 230a and 230b), a plurality of bit line patterns 250a through 250f, a plurality of source line patterns (including a source line pattern 220), a plurality of selection transistors (including selection transistors ST0 and ST1), and a plurality of MTJ devices 260.

The active regions 210 may extend in a third direction, for example, a horizontal direction. The active regions 210 may be formed to be isolated from one another.

The word line patterns 230a and 230b may extend in the third direction, for example, the horizontal direction. The word line patterns 230a and 230b may intersect an active region 210.

The bit line patterns 250a through 250f may extend in a fourth direction, for example, a vertical direction. The bit line patterns 250a through 250f may be arranged to intersect the word line patterns 230a and 230b.

The source line pattern 220 may extend in the third direction. That is, the source line pattern 220 may be aligned in parallel with the word line patterns 230a and 230b. In an example, the source line pattern 220 may be disposed between the word line patterns 230a and 230b and may intersect an active region 210.

The selection transistors ST0 and ST1 may be defined on either side of the source line pattern 220 and may be respectively disposed near the intersections between the word line patterns 230a and 230b and an active region 210. The word line patterns 230a and 230b may serve as gate electrodes for the selection transistors ST0 and ST1, respectively. The drains of the selection transistors ST0 and ST1 may be defined on first sides of the word line patterns 230a and 230b (for example, on the sides of the word line patterns 230a and 230b facing the MTJ devices 260), respectively, and the sources of the selection transistors ST0 and ST1 may be defined on second sides of the word line patterns 230a and 230b (for example, on the sides of the word line patterns 230a and 230b facing the source line pattern 220), respectively. The plurality of source line patterns, including the source line pattern 220, and the active regions 210 may be electrically connected by a plurality of fourth contact plugs 270a, and the bit line patterns 250a through 250f, the active regions 210, and the MTJ devices 260 may be electrically connected by a plurality of fifth contact plugs 270c.

The MTJ devices 260 may be disposed below the bit line patterns 250a through 250f. The MTJ devices 260 may be disposed on the sides of the word line patterns 230a and 230b where the source line pattern 220 is not disposed. The MTJ devices 260 may overlap the active regions 210. In an example, the MTJ devices 260 may be configured to have substantially the same structure as the magnetic memory 10 illustrated in FIG. 2. In this example, the free layers of the MTJ devices 260 may be connected to the bit line patterns 250a through 250f, and the pinned layers of the MTJ devices 260 may be connected to the active regions 210. However, the opposite connections may also be provided in other embodiments.

According to the layout 1b, similar to the layout 1a of FIG. 3, the size of the magnetic memory device 1 in a direction (for example, the horizontal direction) in which the magnetic memory device 1 is to be embedded can be reduced. In addition, the effective width of the active regions 210 for the selection transistors ST0 and ST1 can be increased, and the current driving performance of the selection transistors ST0 and ST1 can be improved.

Figures 5, 6:
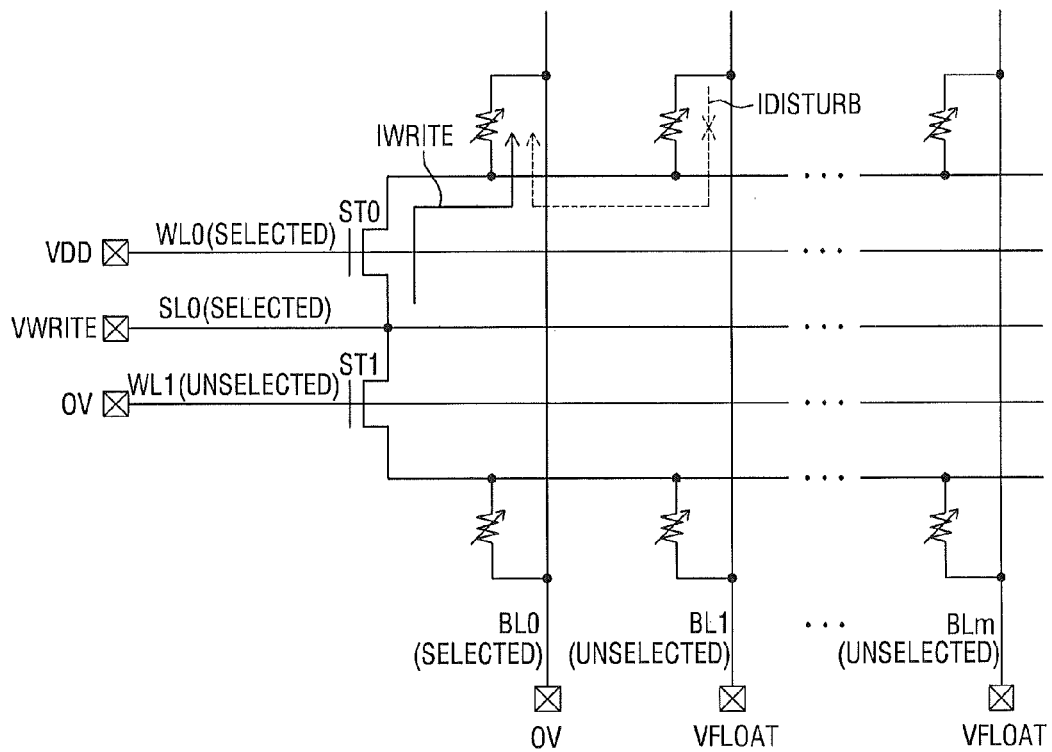
FIG. 5 is a table explaining operating voltages for the magnetic memory device of FIG. 1.
FIG. 6 is a diagram illustrating a program operation of the magnetic memory device of FIG. 1.

FIG. 5 is a table explaining operating voltages for the magnetic memory device 1, and FIG. 6 is a diagram illustrating a program operation of the magnetic memory device 1.

More specifically, FIG. 5 shows operating voltages supplied to a plurality of source lines SL, a plurality of word lines WL, and a plurality of bit lines BL for a read operation or a program operation to be performed on the magnetic memory device 1.

Referring to FIG. 5, to read data from the magnetic memory device 1, a voltage of 0V is supplied to the plurality of source lines SL, a supply voltage VDD is supplied to a word line WL selected from the plurality of word lines WL, a voltage of 0V is supplied to the other non-selected word lines WL, a read voltage VREAD is supplied to a bit line BL selected from the plurality of bit lines BL, and a floating voltage VFLOAT is supplied to the other non-selected bit lines BL. In a non-limiting example, the floating voltage VFLOAT may be higher than the read voltage VREAD. Alternatively, the floating voltage VFLOAT may be lower than the read voltage VREAD.

To program a first data value of, for example, "0", into the magnetic memory device 1, a voltage of 0V is supplied to the plurality of source lines SL, the supply voltage VDD is supplied to a word line WL selected from the plurality of word lines WL, a voltage of 0V is supplied to the other non-selected word lines WL, a write voltage VWRITE is supplied to a bit line BL selected from the plurality of bit lines BL, and the floating voltage VFLOAT is supplied to the other non-selected bit lines BL. In a non-limiting example, the floating voltage VFLOAT may be higher than the write voltage VWRITE. Alternatively, the floating voltage VFLOAT may be lower than the write voltage VWRITE.

To program a second data value of, for example, "1", into the magnetic memory device 1, the write voltage VWRITE is supplied to a source line SL selected from the plurality of source lines SL, a voltage of 0V is supplied to the other non-selected source lines SL, the supply voltage VDD is supplied to a word line WL selected from the plurality of word lines WL, a voltage of 0V is supplied to the other non-selected word lines WL, a voltage of 0V is supplied to a bit line BL selected from the plurality of bit lines BL, and the floating voltage VFLOAT is supplied to the other non-selected bit lines BL.

FIG. 6 illustrates the flow of a write current IWRITE in a case in which the second data value (for example, "1") is written into a magnetic memory 10 of the magnetic memory device 1. For convenience, only part of the magnetic memory device 1 is depicted in FIG. 6.

The supply voltage VDD may be supplied to the first word line WL0, which is selected, so that the first selection transistor ST0 may be turned on. Since a voltage of 0V is supplied to the second word line WL2, which is not selected, the second selection transistor ST1 may be turned off. A voltage of 0V may be supplied to the first bit line BL0, which is selected by the first selection transistor ST0, and the floating voltage VFLOAT may be supplied to the other non-selected bit lines BL1 through BLm. The write voltage VWRITE may be supplied to the first source line SL0, and the write current corresponding to the write voltage VWRITE may flow into the first bit line BL0, which is selected by the first selection transistor ST0. Since the write current IWRITE flows in a direction from one end (e.g., the pinned layer) to the other end (e.g., the free layer) of the magnetic memory 10, a data value of "1" may be stored in the magnetic memory 10. Since there are other magnetic memory elements 10 also connected to the first word line WL0, a disturb current IDISTURB may flow into the first bit line BL0, but not into the other non-selected bit lines BL1 through BLm, because the bit lines BL1 through BLm are floated by being supplied with the floating voltage VFLOAT.

In a case in which data is read from the magnetic memory device 1 or the first data value is written to the magnetic memory device 1, the magnetic memory device 1 may also be driven to prevent the disturb current IDISTURB from flowing into non-selected bit lines.

Figure 7:
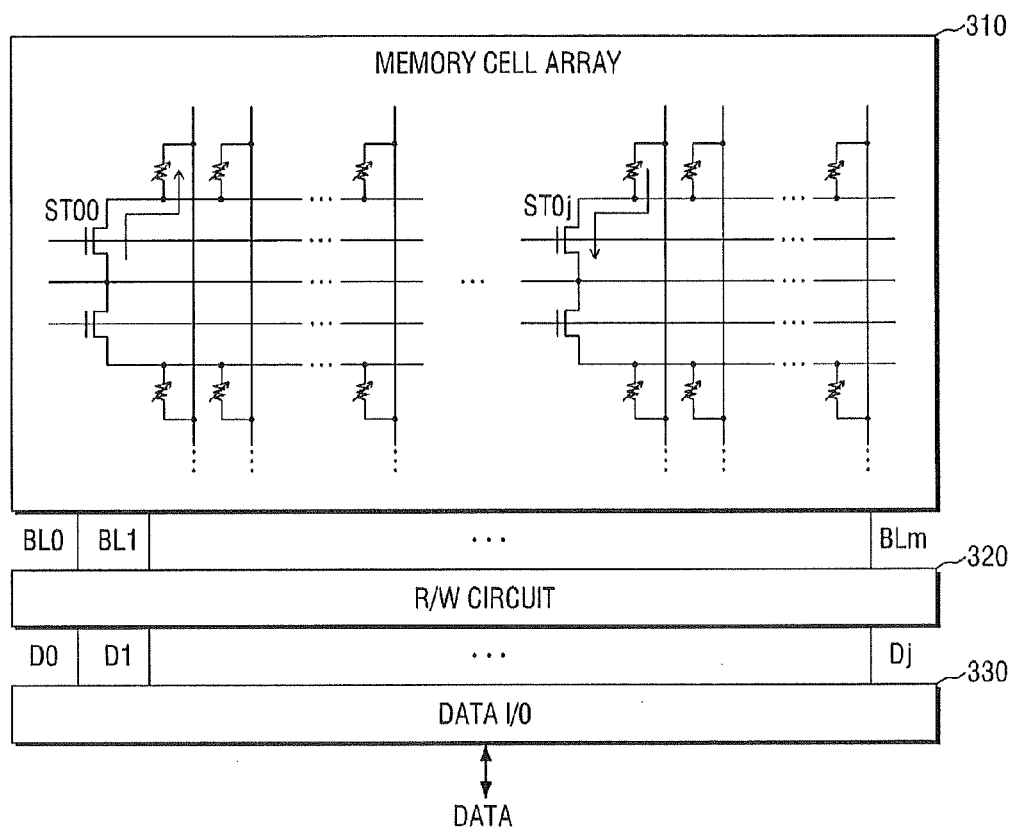
FIG. 7 is a diagram illustrating a magnetic memory device according to other embodiments of the inventive concepts.

FIG. 7 is a diagram illustrating a magnetic memory device according to other embodiments of the inventive concepts.

Referring to FIG. 7, a magnetic memory device 3 may include a memory cell array 310, a read/write (R/W) circuit 320, and a data input/output (I/O) circuit 330.

The memory cell array 310 may include a plurality of magnetic memory elements for storing data. The memory cell array 310 may have the same structure as the memory cell array of the magnetic memory device 1, and may be formed in the layout illustrated in FIG. 3 or 4.

The R/W circuit 320 may include a plurality of sense amplifiers (not illustrated) for reading data from the memory cell array 310 and a plurality of write drivers (not illustrated) for writing data to the memory cell array 310. The R/W circuit 320 may be connected to the memory cell array 310 via a plurality of bit lines BL0 through BLm.

The data I/O circuit 330 may receive data DATA to be written to the memory cell array 310 from an external source (not illustrated). The data I/O circuit 330 may provide the data DATA to the memory cell array 310 via the write drivers. In response to the data DATA being read from the memory cell array 310, the read data may be sensed by the sense amplifiers, and the data I/O circuit 330 may receive the read data and provide it to the outside of the magnetic memory device 3. The data I/O circuit 330 may be connected to the R/W circuit 320 via a plurality of data I/O lines DO through Dj.

The memory cell array 310 may include a plurality of word lines which are connected to a plurality of selection transistors ST00 through ST0j. In an example, there may be provided as many selection transistors ST00 through ST0j as there are data I/O lines DO through Dj. In this example, more than one magnetic memory sharing a single word line together may be divided into a plurality of groups, and each group of magnetic memory elements may share a single selection transistor together.

The selection transistors ST00 through ST0j may be driven individually by using the data I/O lines DO through Dj. In an example, in response to the data DATA being provided via the data I/O lines DO through Dj, a data value of "1" may be stored in the magnetic memory connected to one of the selection transistors ST0 through STj, and at the same time, a data value of "0" may be stored in the magnetic memory connected to another selection transistor.

Figure 8:
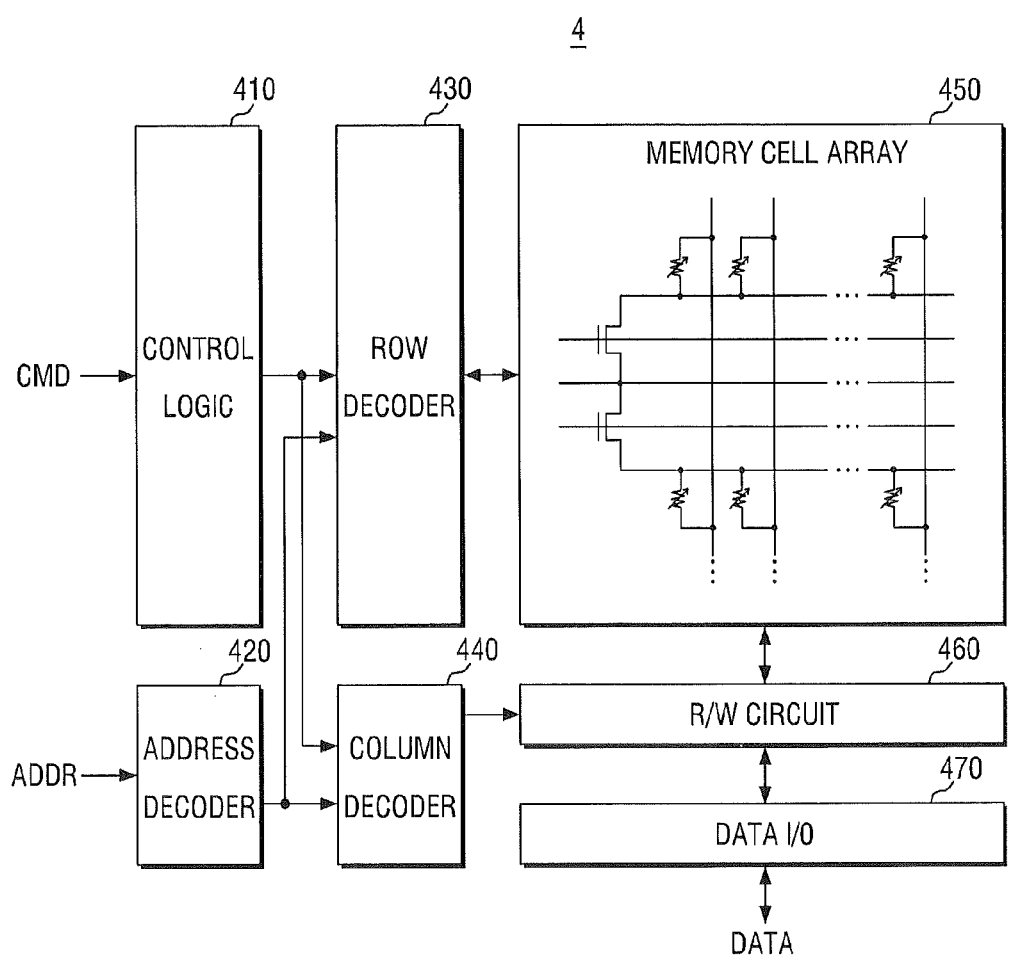
FIG. 8 is a diagram illustrating a magnetic memory device according to other embodiments of the inventive concepts.

FIG. 8 is a diagram illustrating a magnetic memory device according to other embodiments of the inventive concepts.

Referring to FIG. 8, a magnetic memory device 4 may include a control logic 410, an address decoder 420, a row decoder 430, a column decoder 440, a memory cell array 450, an R/W circuit 460, and a data I/O circuit 470.

The control logic 410 may receive a command CMD from an external source, for example, a memory controller (not illustrated), and may control the operation of the magnetic memory device 4 in accordance with the command CMD. In an example, the control logic 410 may generate control signals by decoding the command CMD including a write enable signal /WE, a row address strobe signal /RAS, a column address strobe signal /CAS, and a chip selection signal /CS. The control logic 410 may provide control signals to the row decoder 430 and the column decoder 440 and may thus enable the magnetic memory device 4 to perform a read operation, a write operation or an erase operation.

The address decoder 420 may receive an address ADDR from an external source. In an example, the address decoder 420 may receive an address ADDR including a row address signal ROW_ADDR and a column address signal COL_ADDR, and may provide the row address signal ROW_ADDR to the row decoder 430 and the column address signal COL_ADDR to the column decoder 440.

The row decoder 430 may activate a word line of the memory cell array 450 corresponding to the row address signal ROW_ADDR. The column decoder 440 may activate a bit line of the memory cell array 450 corresponding to the column address signal COL_ADDR via the R/W circuit 460.

The memory cell array 450 may include a plurality of magnetic memory elements for storing data. The memory cell array 450 may have the same structure as the memory cell array of the magnetic memory device 1, and may be formed in the layout illustrated in FIG. 3 or 4.

The memory cell array 450 may include a plurality of word lines which are connected to a plurality of selection transistors. There may be provided as many selection transistors as there are data I/O lines in the memory cell array 450. The selection transistors may be driven individually by using the data I/O lines.

The R/W circuit 460 may include a plurality of sense amplifiers (not illustrated) for reading data from the memory cell array 450 and a plurality of write drivers (not illustrated) for writing data to the memory cell array 450.

The data I/O circuit 470 may receive data DATA to be written to the memory cell array 450 from an external source (not illustrated). The data I/O circuit 470 may provide the data DATA to the memory cell array 450 via the write drivers. In response to the data DATA being read from the memory cell array 450, the read data may be sensed by the sense amplifiers, and the data I/O circuit 470 may receive the read data and provide it to the outside of the magnetic memory device 4.

The magnetic memory device 4 may also include various other elements than those illustrated in FIG. 8.

Figure 9:
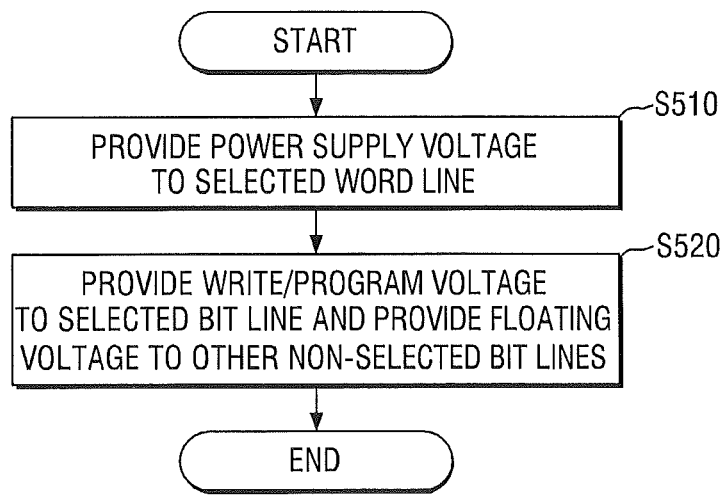
FIG. 9 is a flowchart illustrating an operating method of a magnetic memory device, according to other embodiments of the inventive concepts.

FIG. 9 is a flowchart illustrating an operating method of a magnetic memory device, according to various embodiments of the inventive concepts.

Referring to FIG. 9, for a read operation or a program operation to be performed on a magnetic memory device, a supply voltage VDD may be provided to a word line selected from a plurality of word lines of the magnetic memory device, and a voltage of 0V may be provided to the other non-selected word lines (Block S510).

A read voltage or a program voltage may be provided to a bit line selected from a plurality of bit lines of the magnetic memory device, and a floating voltage may be provided to the other non-selected bit lines (Block S520). More specifically, to read data from the magnetic memory element, a read voltage VREAD may be provided to the selected bit line. To write a first data value of, for example, 0, to the magnetic memory element, a write voltage VWRITE may be provided to the selected bit line. To write a second data value of, for example, "1", to the magnetic memory element, a voltage of 0V may be provided to the selected bit line.

To read data from the magnetic memory element, a voltage of 0V may be provided to a plurality of source lines of the magnetic memory device. To write the first data value to the magnetic memory element, a voltage of 0V may be provided to the source lines. To write the second data value to the magnetic memory element, the write voltage VWRITE may be provided to a source line selected from the source lines, and a voltage of 0V may be provided to the other non-selected source lines.

Figure 10:
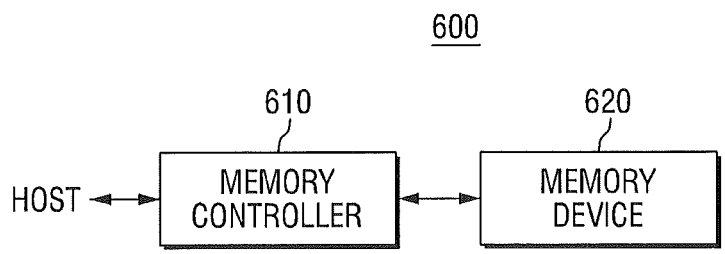
FIG. 10 is a diagram illustrating a memory system including a magnetic memory device, according to other embodiments of the inventive concepts.

FIG. 10 is a diagram illustrating a memory system including a magnetic memory device, according to various embodiments of the inventive concepts.

Referring to FIG. 10, a memory system 600 may include a memory controller 610 and a memory device 620.

The memory controller 610 may control the memory device 620 in response to a request from a host. In an example, the memory controller 610 may control a read operation, a write operation, or an erase operation performed by the memory device 620. The memory controller 610 may transmit a command CMD and an address ADDR to the memory device 620, and may exchange data DATA with the memory device 620. The memory controller 610 may drive firmware for controlling the memory device 620.

The memory device 620 may store data. The memory device 620 may include a memory cell array (not illustrated), and the memory cell array may include a plurality of magnetic memory elements (not illustrated) for storing data. The memory cell array may have the same structure as the memory cell array of the magnetic memory device 1, and may be formed in the layout illustrated in FIG. 3 or 4. The memory controller 610 may also include a memory device therein that may have the same structure as the memory cell array of the magnetic memory device 1, and may be formed in the layout illustrated in FIG. 3 or 4.

The memory cell array may include a plurality of word lines which are connected to a plurality of selection transistors. There may be provided as many selection transistors as there are data I/O lines in the memory cell array. The selection transistors may be driven individually by using the data I/O lines.

Figure 11:
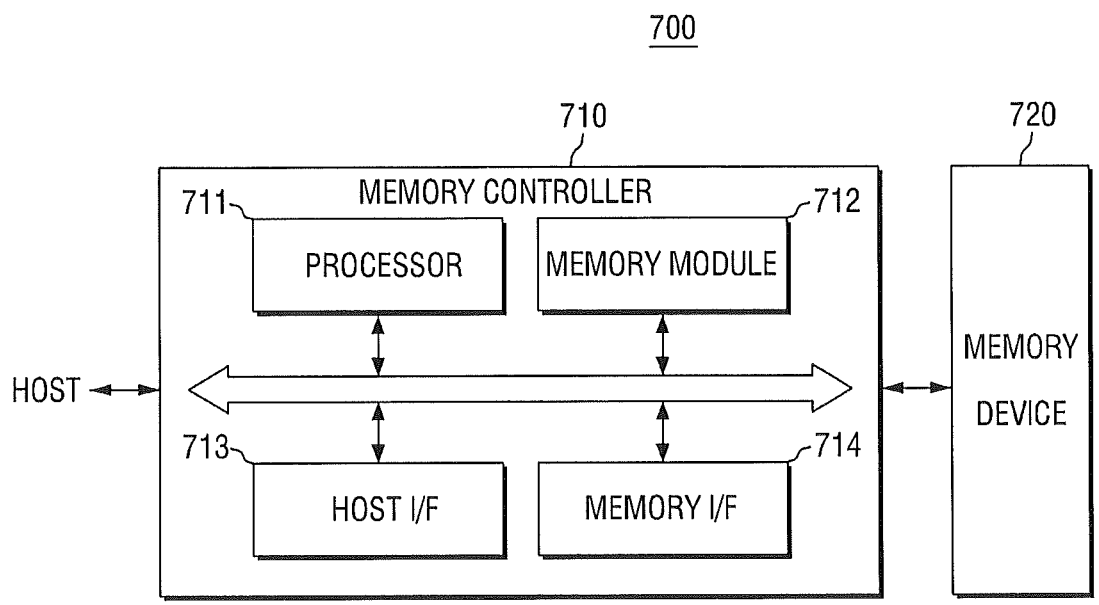
FIG. 11 is a diagram illustrating a memory system including a magnetic memory device, according to other embodiments of the inventive concepts.

FIG. 11 is a diagram illustrating a memory system including a magnetic memory device, according to other embodiments of the inventive concepts.

Referring to FIG. 11, a memory system 700 may include a memory controller 710 and a memory device 720.

The memory controller 710 may control the memory device 720 in response to a request from a host. The memory controller 710 may control a read operation, a write operation, or an erase operation performed by the memory device 720. The memory controller 710 may transmit a command CMD and an address ADDR to the memory device 720, and may exchange data DATA with the memory device 720. The memory controller 710 may drive firmware for controlling the memory device 720.

The memory controller 710 may include a processor 711, a magnetic memory module 712, a host interface 713, and a memory interface 714.

The processor 711 may control the general operation of the memory controller 710.

The memory module 712 may serve as an operating memory for temporarily storing commands and/or data. The memory module 712 may also serve as a buffer memory. In an example, the memory module 712 may receive data to be programmed into the memory device 720 from a host, and may temporarily store the received data. During a write operation, the data temporarily stored in the memory module 712 may be transmitted to and then written to the memory device 720. The memory module 712 may also temporarily store data read from the memory device 720.

The memory module 712 may include a memory cell array (not illustrated), and the memory cell array may include a plurality of magnetic memory elements (not illustrated) for storing data. The memory cell array may have the same structure as the memory cell array of the magnetic memory device 1, and may be formed in the layout illustrated in FIG. 3 or 4. Moreover, any of the other elements of FIG. 12 may also include therein a memory cell array which may have the same structure as the memory cell array of the magnetic memory device 1, and may be formed in the layout illustrated in FIG. 3 or 4.

The memory cell array may include a plurality of word lines which are connected to a plurality of selection transistors. There may be provided as many selection transistors as there are data I/O lines in the memory cell array. The selection transistors may be driven individually by using the data I/O lines.

The host interface 713 may interface with the host. In an example, the host interface 713 may include a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Systems Interface (SCSI) protocol, an Enhanced Small Disk Interface (ESDI) protocol, and/or an Integrated Drive Electronics (IDE) protocol.

The memory interface 714 may interface with the memory device 720.

The memory device 720 may store data. The memory device 720 may include a volatile memory device such as a Dynamic Random Access Memory (DRAM) device, a Single Data Rate (SDR) Synchronous DRAM (SDRAM) device, or a Double Data Rate (DDR) SDRAM device, or may include a nonvolatile memory device such as a Read Only Memory (ROM) device, an Electrically Erasable and Programmable ROM (EEPROM) device, and/or a flash memory device.

Figure 12:
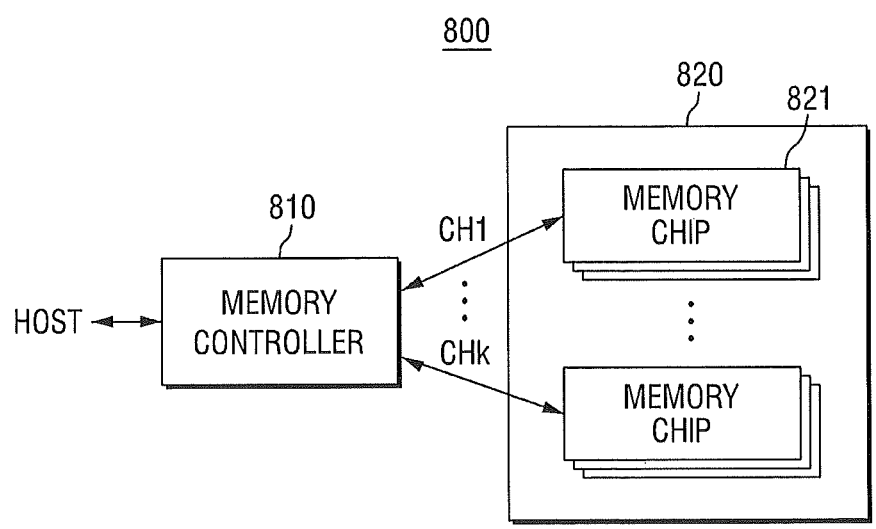
FIG. 12 is a diagram illustrating a memory system including a magnetic memory device, according to other embodiments of the inventive concepts.

FIG. 12 is a diagram illustrating a memory system including a magnetic memory device, according to other embodiments of the inventive concepts.

Referring to FIG. 12, a memory system 800 may include a memory controller 810 and a memory device 820.

The memory controller 810 may control the memory device 820 in response to a request from a host. The memory controller 810 may control a read operation, a write operation, or an erase operation performed by the memory device 820. The memory controller 810 may transmit a command CMD and an address ADDR to the memory device 820, and may exchange data DATA with the memory device 820. The memory controller 810 may drive firmware for controlling the memory device 820.

The memory device 820 may include a plurality of memory chips 821 for storing data. The memory chips 821 may be divided into a plurality of groups, and each group of memory chips 821 may interface with the memory controller 810 via a single channel. In an example, the memory chips 821 may interface with the memory controller 810 via a plurality of first through k-th channels CH1 through CHk.

The memory controller 810 and/or the memory device 820 may include a memory cell array (not illustrated), and the memory cell array may include a plurality of magnetic memory elements (not illustrated) for storing data. The memory cell array may have the same structure as the memory cell array of the magnetic memory device 1, and may be formed in the layout illustrated in FIG. 3 or 4.

The memory cell array may include a plurality of word lines which are connected to a plurality of selection transistors. There may be provided as many selection transistors as there are data I/O lines in the memory cell array. The selection transistors may be driven individually by using the data I/O lines.

FIG. 12 illustrates a plurality of memory chips 821 as being connected in common to a single channel, but the present inventive concepts are not limited to this. That is, a single memory chip 821 may be connected to a single channel.

Figure 13:
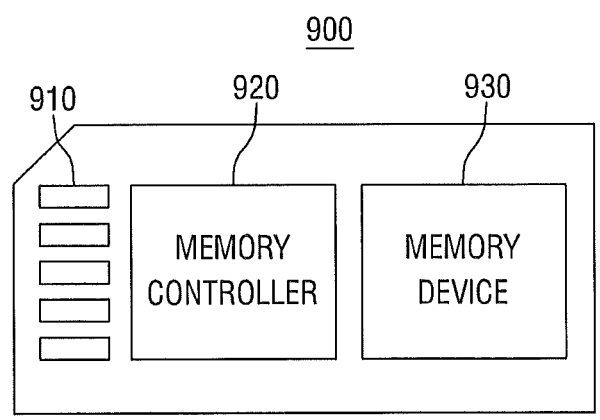
FIG. 13 is a diagram illustrating a memory card including a magnetic memory device, according to other embodiments of the inventive concepts.

FIG. 13 is a diagram illustrating a memory card including a magnetic memory device, according to other embodiments of the inventive concepts.

Referring to FIG. 13, a memory card 900 may include a card access unit 910, a memory controller 920, and a memory device 930.

The card access unit 910 may include a plurality of pins, and the plurality of pins may include a command pin, a data pin, a clock pin, a power pin, etc. The number of pins provided may vary depending on the type of the memory card 900.

The memory controller 920 may control the memory device 930 in response to a command being received via the card access unit 910. The memory controller 920 may write data to or read data from the memory device 930.

The memory device 930 may serve as storage space for the memory card 900.

The memory controller 920 and/or the memory device 930 may include a memory cell array (not illustrated), and the memory cell array may include a plurality of magnetic memory elements (not illustrated) for storing data. The memory cell array may have the same structure as the memory cell array of the magnetic memory device 1, and may be formed in the layout illustrated in FIG. 3 or 4.

The memory cell array may include a plurality of word lines which are connected to a plurality of selection transistors. There may be provided as many selection transistors as there are data I/O lines in the memory cell array. The selection transistors may be driven individually by using the data I/O lines.

For example, the memory card 900 may be implemented as a personal computer (PC) card (such as a Personal Computer Memory Card International Association (PCMCIA) card), a Compact Flash (CF) card, a Smart Media Card (SMC), a memory stick, a MMC (such as RS-MMC, MMCmicro, etc.), a Secure Digital (SD) card (such as miniSD, microSD, SDHC, etc.), and/or a Universal Flash Storage (UFS).

Figure 14:
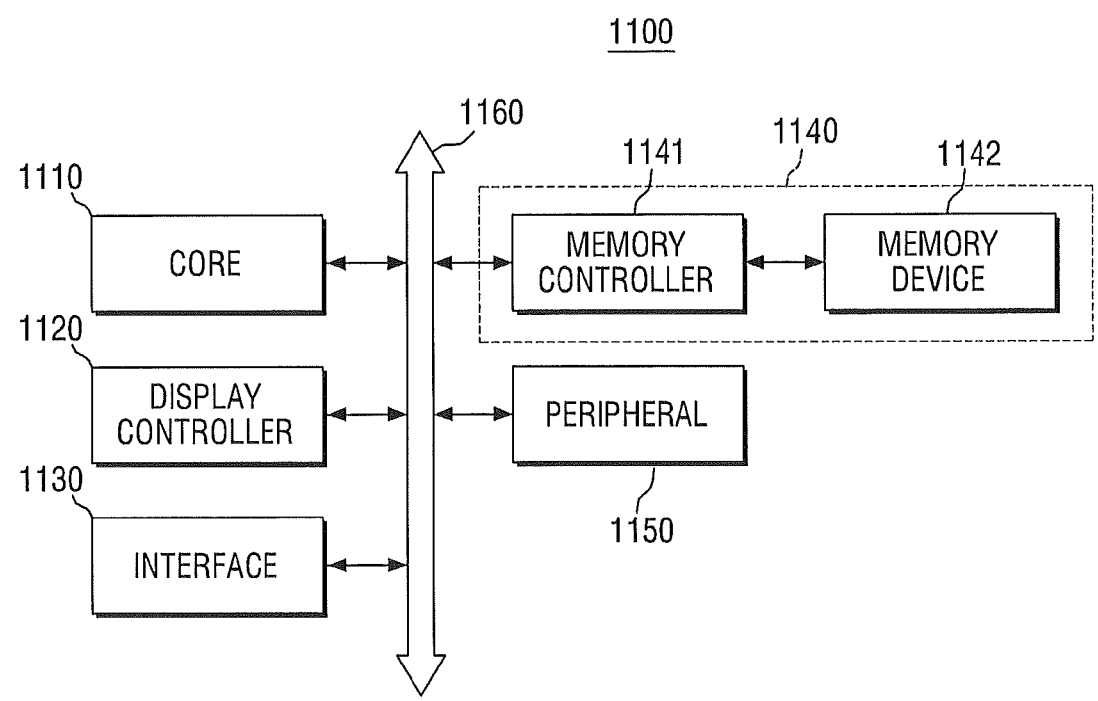
FIG. 14 is a diagram illustrating a semiconductor system including a magnetic memory device, according to other embodiments of the inventive concepts.

FIG. 14 is a diagram illustrating a semiconductor system including a magnetic memory device, according to other embodiments of the inventive concepts.

Referring to FIG. 14, a semiconductor system 1100 may include a core processor 1110, a display controller 1120, an interface device 1130, a memory system 1140, a peripheral device 1150, and a data bus 1160.

The core processor 1110, the display controller 1120, the interface device 1130, the memory system 1140, and the peripheral device 1150 may be connected to one another by the data bus 1160. The data bus 1160 may provide a path via which data can be transmitted.

The core processor 1110 may include a single core or a plurality of cores, and may process data by using the core(s). In an example, the core processor 1110 may include a multi-core processor such as a dual-core processor, a quad-core processor, and/or a hexa-core processor. The core processor 1110 may also include a cache memory (not illustrated) disposed in and/or outside the core processor 1110.

The display controller 1120 may control a display device (not illustrated), and may control the display device to display images.

The interface device 1130 may transmit data to or receive data from a communication network (not illustrated). In an example, the interface device 1130 may include an antenna (not illustrated) or a wired or wireless transceiver (not illustrated).

The memory system 1140 may store commands and/or data. The memory system 1140 may include a memory controller 1141 and a memory device 1142. The memory controller 1141 may control the memory device 1142 in response to a command being received via the data bus 1160. The memory device 1142 may store data.

The memory controller 1141, the memory device 1142 and/or any of the other blocks of FIG. 14 may include a memory cell array (not illustrated), and the memory cell array may include a plurality of magnetic memory elements (not illustrated) for storing data. The memory cell array may have the same structure as the memory cell array of the magnetic memory device 1, and may be formed in the layout illustrated in FIG. 3 or 4.

The memory cell array may include a plurality of word lines which are connected to a plurality of selection transistors. There may be provided as many selection transistors as there are data I/O lines in the memory cell array. The selection transistors may be driven individually by using the data I/O lines.

The peripheral device 1150 may include a serial communication device, a memory management device, an audio processing device, etc.

Figure 15:
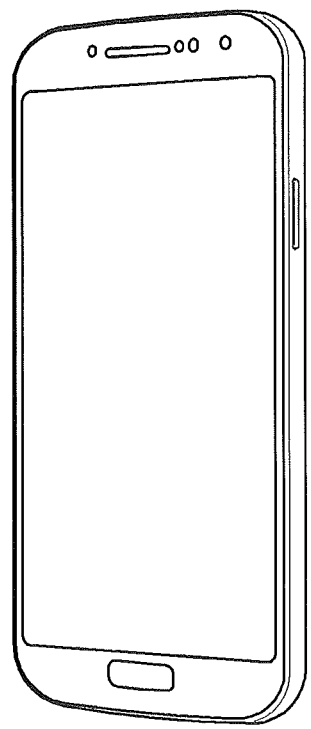
FIG. 15 is a diagram illustrating an example of an electronic device to which the semiconductor system of FIG. 14 is applicable.

FIG. 15 is a diagram illustrating an example of an electronic device to which the semiconductor system 1100 is applicable.

Referring to FIG. 15, in a case in which the semiconductor system 1100 is applied to a smart phone 1200, at least part of the semiconductor system 1100 may be implemented in the form of a System-On-Chip (SOC).

The semiconductor system 1100 may also be applicable to various electronic devices other than the smart phone 1200. In an example, the semiconductor system 1100 may be provided as a computer, an Ultra Mobile PC (UMPC), a work station, a net-book computer, a Personal Digital Assistant (PDA), a portable computer, a web tablet, a wireless phone, a mobile phone, an e-book, a portable multimedia player (PMP), a portable game console, a navigation device, a digital camera, a television set, a digital audio recorder, a digital audio player, a digital picture recorder, a digital picture player, a digital video recorder, a digital video player, a device capable of transmitting and receiving data in a wireless environment, one of a variety of electronic devices that constitute a home network, one of a variety of electronic devices that constitute a computer network, one of a variety of electronic devices that constitute a telematics network, a radio frequency identification (RFID) device, and/or one of a variety of electronic devices that constitute a computing system.

In concluding the detailed description, those skilled in the art will appreciate that many variations and modifications can be made to the disclosed embodiments without substantially departing from the principles of the present inventive concepts. Therefore, the disclosed embodiments of the inventive concepts are used in a generic and descriptive sense only and not for purposes of limitation.

What is claimed is:

1. A magnetic memory device, comprising:
a plurality of word line patterns extending in a first direction;
a plurality of bit line patterns extending in a second direction which intersects the first direction;
a plurality of source line patterns extending in the first direction, a respective one of which is disposed between a respective pair of adjacent word line patterns among the plurality of word line patterns;
a plurality of magnetic memory elements disposed below the plurality of bit line patterns; and
a plurality of metal wiring patterns extending in the first direction,
wherein a respective one of the magnetic memory elements is disposed at a respective intersection of the plurality of bit line patterns and the plurality of metal wiring patterns, when viewed in a plan view.

2. The magnetic memory device of claim 1, further comprising:
a plurality of active regions extending in the second direction,
wherein the plurality of bit line patterns extending in the second direction are isolated from the plurality of active regions extending in the second direction.

3. The magnetic memory device of claim 1, wherein the plurality of word line patterns extending in the first direction and the plurality of bit line patterns extending in the second direction do not intersect each other.

4. The magnetic memory device of claim 3, wherein the plurality of source line patterns extending in the first direction and the plurality of bit line patterns extending in the second direction do not intersect each other.

5. The magnetic memory device of claim 1, further comprising:
a plurality of active regions,
wherein the plurality of magnetic memory elements are disposed side-by-side on either side of the plurality of active regions, and
wherein the plurality of word line patterns extending in the first direction and the plurality of source line patterns extending in the first direction intersect the plurality of bit line patterns extending in the second direction.

6. A magnetic memory device, comprising:
first and second metal wiring patterns extending in a first direction;
a plurality of bit lines extending in a second direction and intersecting the first and second metal wiring patterns;
a plurality of magnetic memory elements, a respective one of which is disposed at a respective intersection of the first and second metal wiring patterns and the plurality of bit lines when viewed in a plan view;

first and second word lines extending in the first direction;

a source line extending in the first direction between the first and second metal wiring patterns;

first selection field effect transistor (FET), a drain of which is connected to the first metal wiring pattern, a source of which is connected to the source line and a gate of which is connected to the first word line; and a second selection FET, a drain of which is connected to the second metal wiring pattern, a source of which is connected to the source line and a gate of which is connected to the second word line.

7. The magnetic memory device of claim 6 wherein the first word line is between the first metal wiring pattern and the source line, and the second word line is between the second metal wiring pattern and the source line.

8. The magnetic memory device of claim 7 wherein the first and second selection FETs are offset from the plurality of magnetic memory elements in the first direction.

9. The magnetic memory device of claim 6 wherein the first and second word lines intersect the plurality of bit lines.

10. The magnetic memory device of claim 9 wherein the source line intersects the plurality of bit lines.

* * * * *